United States Patent
Koh et al.

(10) Patent No.: US 7,862,988 B2
(45) Date of Patent: Jan. 4, 2011

(54) METHOD FOR FORMING PATTERNS OF SEMICONDUCTOR DEVICE

(75) Inventors: Cha-Won Koh, Yongin-si (KR); Yool Kang, Seongnam-si (KR); Sang-Gyun Woo, Yongin-si (KR); Seok-Hwan Oh, Suwon-si (KR); Gi-Sung Yeo, Seoul (KR); Ji-Young Lee, Yongin-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 560 days.

(21) Appl. No.: 11/529,310

(22) Filed: Sep. 29, 2006

(65) Prior Publication Data
US 2007/0077524 A1    Apr. 5, 2007

(30) Foreign Application Priority Data
Sep. 30, 2005    (KR)    ............... 10-2005-0092329

(51) Int. Cl.
*G03F 7/26*    (2006.01)
(52) U.S. Cl. ...................................................... 430/314
(58) Field of Classification Search ................. 430/312, 430/313, 314, 323, 324, 316, 331, 328
See application file for complete search history.

(56) References Cited
U.S. PATENT DOCUMENTS

| | | | | |
|---|---|---|---|---|
| 4,863,557 A | * | 9/1989 | Kokaku et al. | 216/22 |
| 5,308,742 A | * | 5/1994 | Ta | 430/313 |
| 5,648,198 A | * | 7/1997 | Shibata | 430/296 |
| 5,858,620 A | * | 1/1999 | Ishibashi et al. | 430/313 |
| 6,239,008 B1 | | 5/2001 | Yu et al. | |
| 2002/0090534 A1 | * | 7/2002 | Shirasaki et al. | 428/692 |
| 2004/0063042 A1 | * | 4/2004 | Egbe | 430/329 |
| 2004/0185382 A1 | * | 9/2004 | Byun et al. | 430/313 |

FOREIGN PATENT DOCUMENTS

| | | |
|---|---|---|
| KR | 100155880 | 7/1998 |
| KR | 10-2002-0046040 | 6/2002 |

OTHER PUBLICATIONS

English Translation: KR 2002-0046040; Jun. 20, 2009.*

* cited by examiner

*Primary Examiner*—Kathleen Duda
*Assistant Examiner*—Caleen O Sullivan
(74) *Attorney, Agent, or Firm*—Harness, Dickey & Pierce., P.L.C.

(57) ABSTRACT

Provided is a method for forming patterns of a semiconductor device. According to the method, first mask patterns may be formed on a substrate, and second mask patterns may be formed on sidewalls of each first mask pattern. Third mask patterns may fill spaces formed between adjacent second mask patterns, and the second mask patterns may be removed. A portion of the substrate may then be removed using the first and third mask patterns as etch masks.

21 Claims, 8 Drawing Sheets

Fig. 1

(CONVENTIONAL ART)

Fig. 2

(CONVENTIONAL ART)

Fig. 3

(CONVENTIONAL ART)

Fig. 4

(CONVENTIONAL ART)

Fig. 5

(CONVENTIONAL ART)

Fig. 6

(CONVENTIONAL ART)

METHOD FOR FORMING PATTERNS OF SEMICONDUCTOR DEVICE

PRIORITY STATEMENT

This application claims the benefit of priority under 35 USC §119 to Korean Patent Application No. 2005-92329 filed on Sep. 30, 2005, the entire contents of which are incorporated herein by reference.

BACKGROUND OF THE INVENTION

1. Field of the Invention

Example embodiments relate to a method for manufacturing a semiconductor device. More particularly, example embodiments relate to a method for forming patterns in a semiconductor device.

2. Description of the Related Art

A semiconductor device generally includes elements having patterns of various structures formed on a semiconductor substrate. These elements may be electrically connected to perform various operations. Arranging elements in a unit area of a semiconductor device with a high degree of integration is actively being researched. For example, in semiconductor devices, the same pattern may be repeatedly arranged in a cell array of a semiconductor memory device including highly integrated memory cells and thus, a double exposure technology for forming these patterns is under development. However, in conventional double exposure technologies, a technical limitation is generally reached when a linewidth of a pattern is 40 nm or less.

FIGS. 1 through 4 illustrate a method for forming patterns using conventional double exposure technology.

Figure 1:
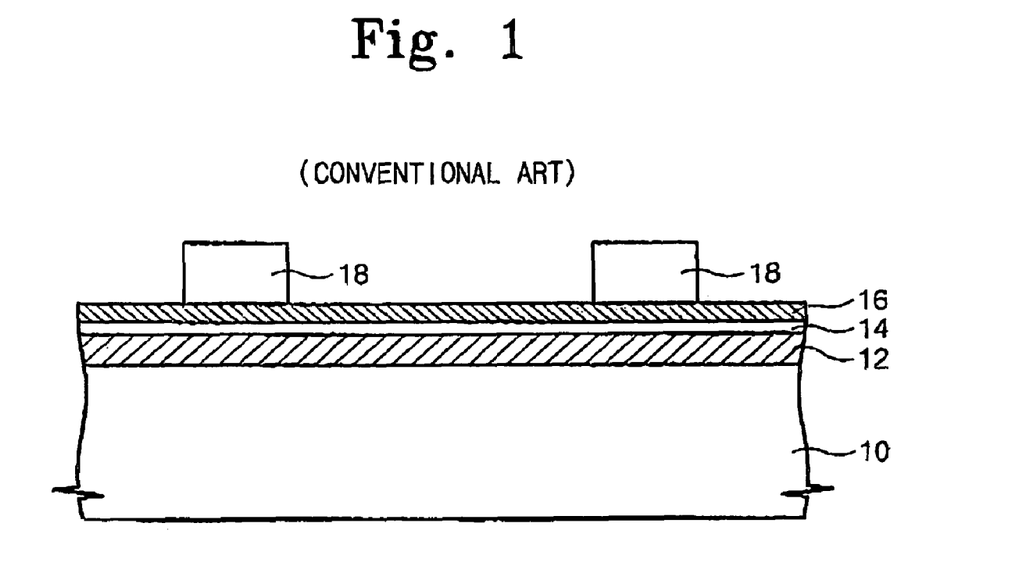
FIGS. 1-4 are cross-sectional views illustrating a conventional method for forming a pattern.

Referring to FIG. 1, a material layer 12 used for forming patterns may be formed on a semiconductor substrate 10. A first mask layer 14 and a second mask layer 16 may be formed on the material layer 12. A first photoresist pattern 18 may be formed on the second mask layer 16.

Figure 2:
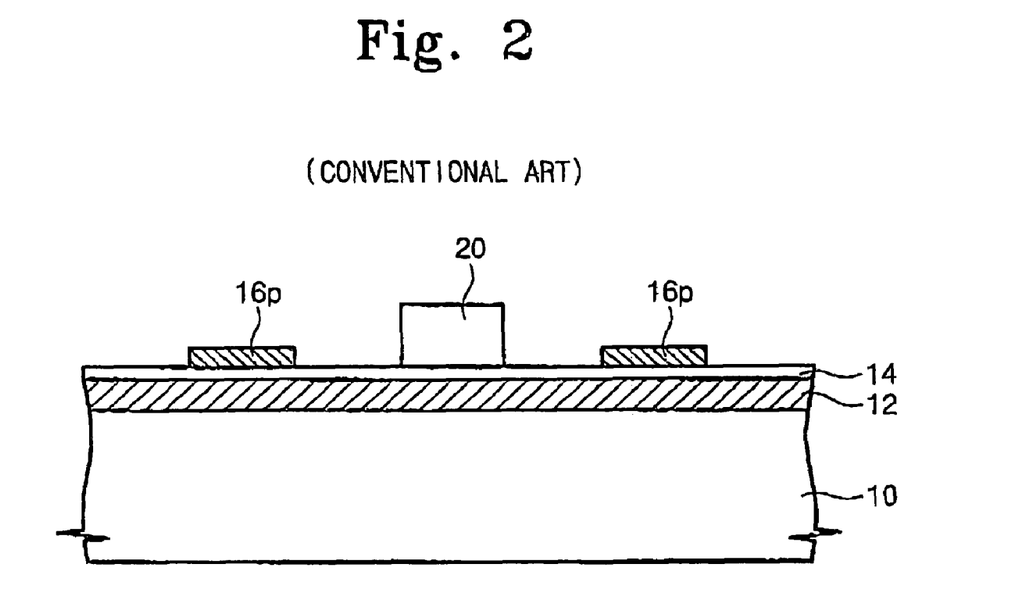

Referring to FIG. 2, the second mask layer 16 may be patterned using the first photoresist pattern 18 as an etch mask to form a hard mask pattern 16p on the first mask layer 14. Next, the first photoresist pattern 18 may be removed, and a second photoresist pattern 20 may be formed on the first mask layer 14.

Figure 3:
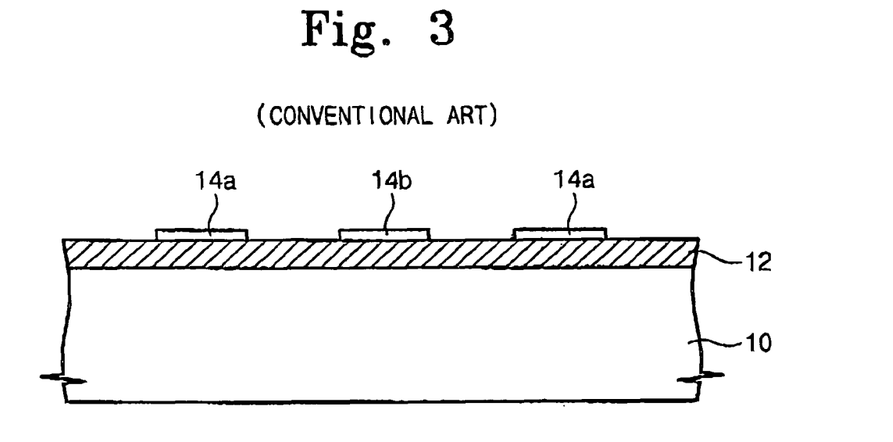

Referring to FIG. 3, the first mask layer 14 may be patterned using the second photoresist pattern 20 and the hard mask pattern 16p as etch masks to form a mask layer including a first pattern 14a and a second pattern 14b. The hard mask pattern 16p may be used to form the first pattern 14a and the second photoresist pattern 20 may be used to form the second pattern 14b.

Figure 4:
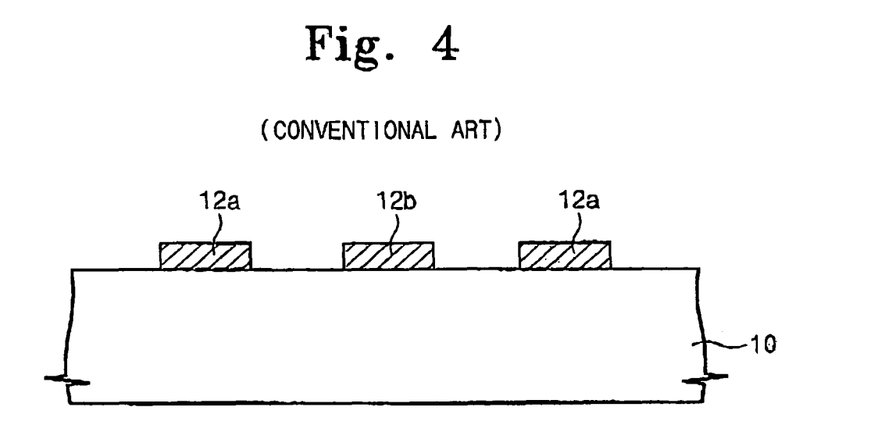

Referring to FIG. 4, the material layer 12 may be patterned using the first pattern 14a and the second pattern 14b as etch masks to form a first material layer pattern 12a and a second material layer pattern 12b.

According to this conventional method, the first material layer patterns 12a and the second material layer patterns 12b may be alternately arranged on the substrate 10. However, in this conventional method, a pattern of a scale of 80 nm may be formed using light having a wavelength of 248 nm by dividing patterns having a small pitch into two groups and performing a double exposure.

Figure 5:
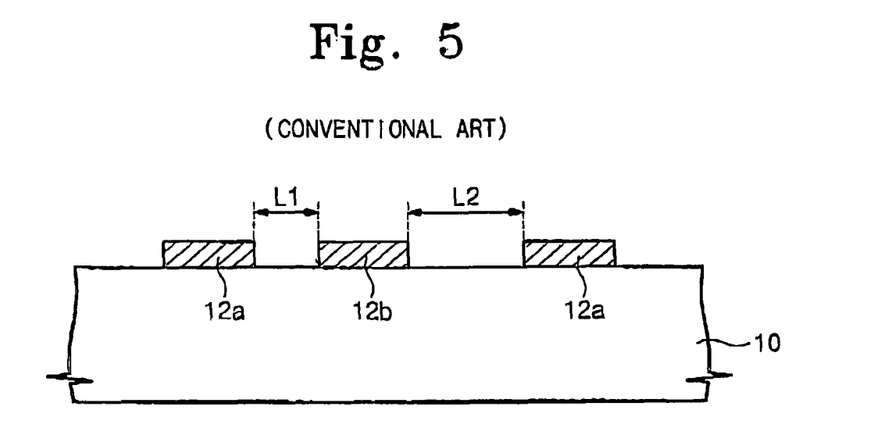
FIGS. 5 and 6 are views illustrating problems associated with the conventional method.
Figure 6:
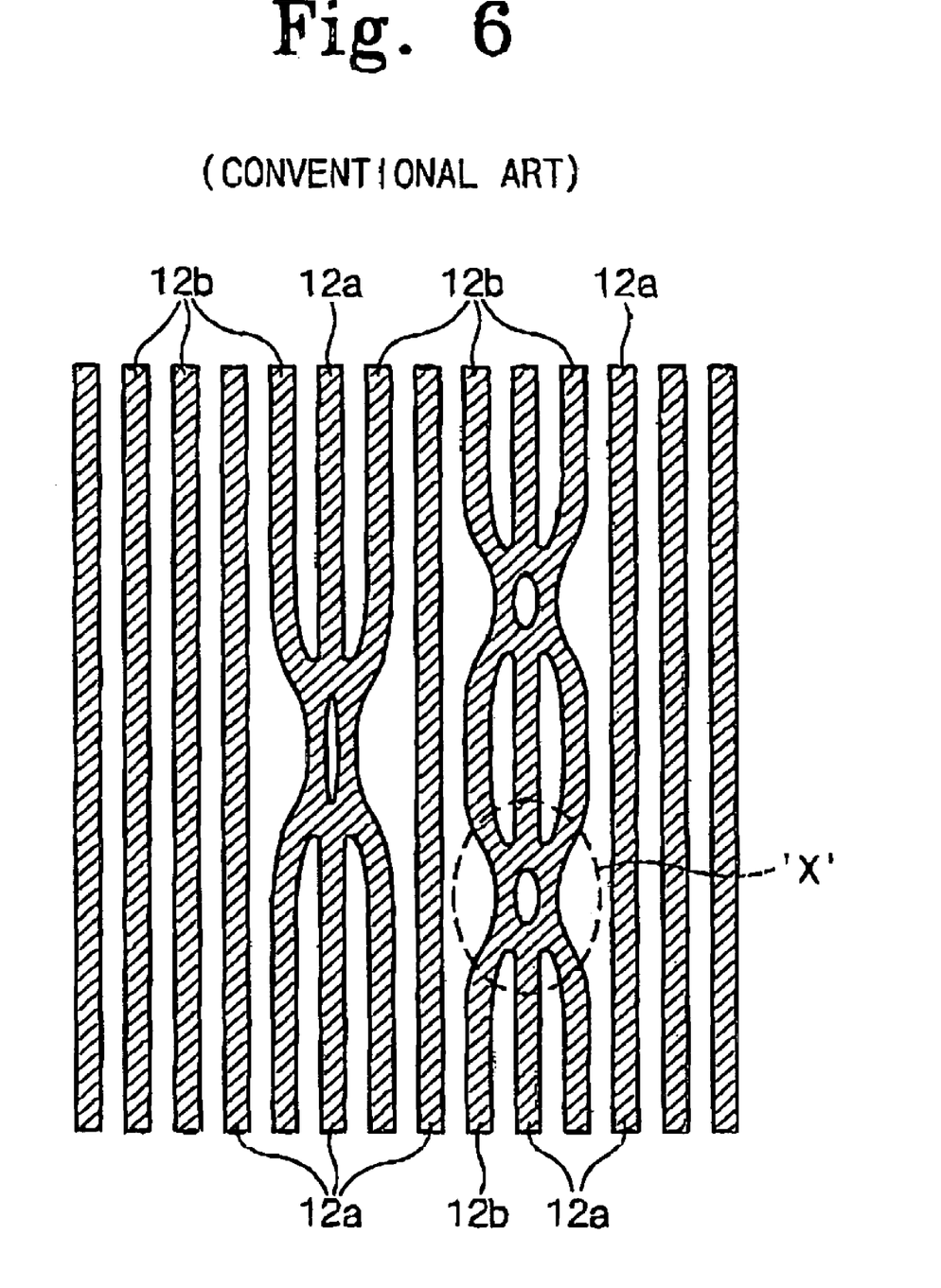

However, in the conventional method using double exposure, if a mask layer for a first exposure process and a mask layer for a second exposure process are misaligned, the first material layer pattern 12a and the second material layer pattern 12b are misaligned. Accordingly, a difference between left and right intervals L1 and L2 of the second material layer pattern 12b may occur as illustrated in FIG. 5. Such a difference may cause defects in patterns. A pattern defect may occur when the first material layer pattern 12a and the second material layer pattern 12b contact each other. For example, the pattern defect X illustrated in FIG. 6 may occur if a resist used for forming the second photoresist pattern 20 remains in the vicinity of the hard mask pattern 16 and/or if the first mask layer 14 remains between the second photoresist pattern 20 and the hard mask pattern 16. Further, the pattern defect X may occur if a pitch of the pattern is small or if the mask layer for the first exposure process and the mask layer for the second exposure process are misaligned.

SUMMARY

Example embodiments provide a method for forming repeating patterns having a constant pitch.

Example embodiments provide a method for forming fine patterns using a single exposure. Stated differently, example embodiments provide a method for forming fine patterns without performing a double exposure.

Example embodiments provide a method for forming a pattern. The method may include forming a plurality of first mask patterns on a substrate; forming a second mask pattern on sidewalls of each first mask pattern; forming a third mask pattern at least partially filling a space between second mask patterns; removing the second mask patterns; and removing a portion of the substrate using the first and third mask patterns as etch masks.

According to an example embodiment, the first mask pattern and the third mask pattern may be formed of an organic layer containing silicon, and a second mask layer may be formed of an organic layer not containing silicon. The organic layer containing silicon may be removed using oxygen plasma ashing, while the organic layer not containing silicon may remain because a silicon oxide layer may be formed on a portion of the organic layer that contacts oxygen plasma. Accordingly, only the second mask layer not containing silicon may be selectively removed by considering the characteristics of the organic layer containing silicon.

According to an example embodiment, a second mask pattern may be formed of a photoresist having a developing speed higher than developing speeds of the first and third mask patterns. According to an example embodiment, only the second mask pattern may be selectively removed using opposed exposure and developing characteristics of a positive resist and a negative resist.

According to example embodiments, second mask patterns may be formed on the first mask patterns having a constant pitch such that each second mask pattern is spaced apart from an adjacent second mask pattern. The second mask pattern may be formed to have a desired thickness by considering chemical absorption of a photoresist.

BRIEF DESCRIPTION OF THE DRAWINGS

The accompanying drawings, which are included to provide a further understanding of the example embodiments are incorporated in and constitute a part of this disclosure. The accompany drawings, when considered together with the detailed description of the example embodiments, are believed to provide a thorough and complete disclosure. In the drawings.

DETAILED DESCRIPTION OF EXAMPLE EMBODIMENTS

Example embodiments are described more fully hereinafter with reference to the accompanying drawings, in which example embodiments are shown. This invention may, however, be embodied in many different forms and should not be construed as limited to the example embodiments set forth herein. Rather, these example embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present. In contrast, when an element is referred to as being "directly on" another element, there are no intervening elements present. As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another. For example, a first thin film could be termed a second thin film, and, similarly, a second thin film could be termed a first thin film without departing from the teachings of the disclosure.

The terminology used herein is for the purpose of describing particular example embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the drawings. It will be understood that relative terms are intended to encompass different orientations of the device in addition to the orientation depicted in the drawings. For example, if the device in one of the drawings is turned over, elements described as being on the "lower" side of other elements would then be oriented on "upper" sides of the other elements. The exemplary term "lower," can therefore, encompasses both an orientation of "lower" and "upper," depending of the particular orientation of the figure. Similarly, if the device in one of the drawings is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Example embodiments are described herein with reference to cross section illustrations that are schematic illustrations of idealized embodiments. As such, variations from the shapes of the illustrations as a result, for example, of manufacturing techniques and/or tolerances, are to be expected. Thus, the example embodiments should not be construed as limited to the particular shapes of regions illustrated herein but are to include deviations in shapes that result, for example, from manufacturing. For example, a region illustrated or described as flat may have rough and/or nonlinear features. Moreover, sharp angles that are illustrated may be rounded. Thus, the regions illustrated in the drawings are schematic in nature and their shapes are not intended to illustrate the precise shape of a region and are not intended to limit the scope of the present invention. It is also noted that the thicknesses of layers and regions shown in the drawings may be exaggerated for clarity.

Hereinafter, example embodiments are explained in detail with reference to the accompanying drawings.

Figure 7:
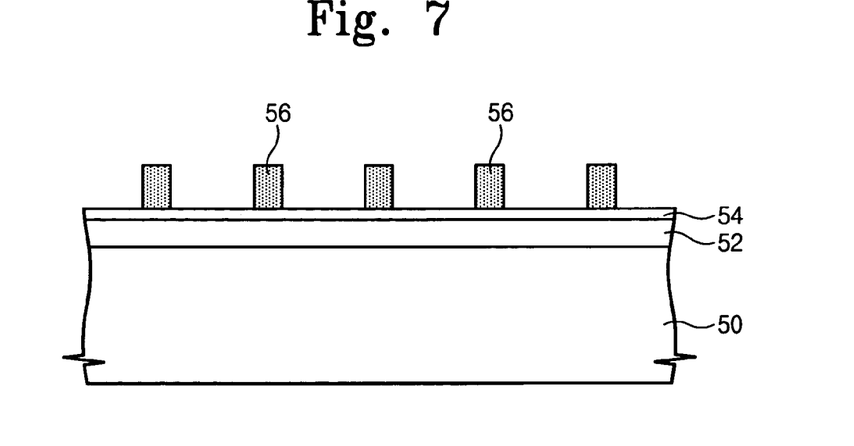
FIGS. 7-11 are cross-sectional views illustrating an example embodiment of a method for forming a pattern.
Figure 11:
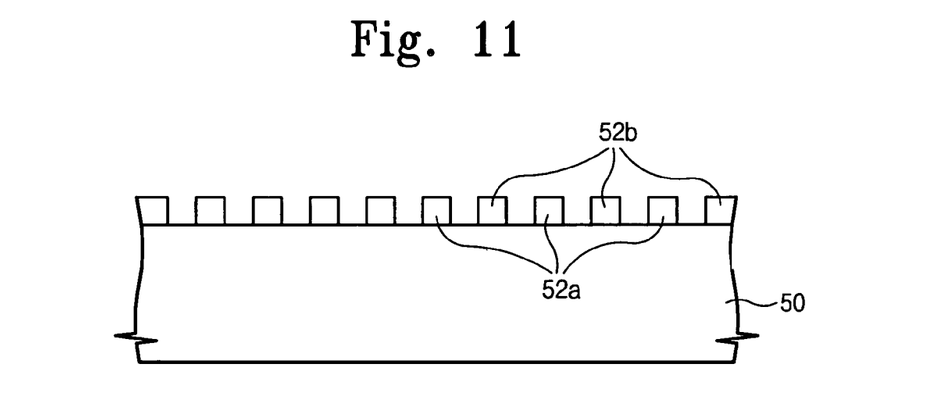

FIGS. 7 and 11 are cross-sectional views illustrating an example embodiment of a method for forming a pattern.

Referring to FIG. 7, a material layer 52 to be etched may be formed on a semiconductor substrate 50. A hard mask layer 54 may be formed on the material layer 52. An anti-reflection layer (not shown) may be formed on the hard mask layer 54. A plurality of first mask patterns 56 may be formed on the hard mask layer 54. The first mask patterns 56 may be arranged in a stripe shape and may have a constant pitch. For example, the first mask patterns 56 may be arranged at an interval three times greater than a linewidth of each mask pattern 56. According to an example embodiment, each of the first mask patterns 56 may be formed of an organic layer containing silicon. For example, each of the first mask patterns 56 may be formed of a photoresist containing silicon.

According to an example embodiment, the first mask patterns 56 may be formed with a first linewidth defined by an exposure process. The first line width may correspond to the minimum linewidth that can be formed by an exposure process. However, the first linewidth may be reduced below the minimum linewidth defined by the exposure process using a photoresist trimming process. For example, the first mask patterns 56 may be formed with a first linewidth of 50 nm and then, the linewidth may be reduced up to 30 nm by the trimming process, thereby providing a linewidth of 20 nm.

Figure 8:
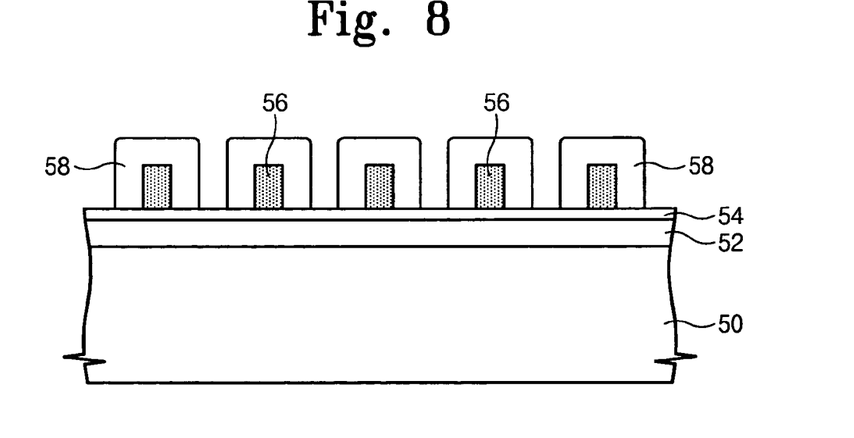

Referring to FIG. 8, second mask patterns 58 may be formed on the first mask patterns 56. The second mask patterns 58 may be formed of an organic layer, which does not contain silicon. A second mask pattern 58 may be separated from an adjacent second mask pattern 58 by a desired and/or a predetermined interval. Each second mask pattern 58 may have a shape corresponding to each first mask pattern 56. Therefore, the second mask patterns 58 may create a line-shaped gap parallel to the first mask pattern 56 and located between adjacent first mask patterns 56.

According to an example embodiment, a thickness of each second mask pattern 58 formed on a sidewall of each mask pattern 56, a linewidth of each mask pattern 56 and an interval between adjacent first mask patterns 56 may be used to control a thickness of the interval between adjacent second mask patterns 58. For example, a thickness of each second mask pattern 58 formed on a sidewall of each first mask pattern 56 may be the same as the linewidth of the first mask pattern 56. An interval between the second mask patterns 58 may also be the same as the width of the first mask pattern 56. If the interval between the first mask patterns 56 is equal to a distance three times the linewidth of each first mask pattern 56 and the thickness of each second mask pattern 58 formed on the sidewalls of each first mask pattern 56 is equal the linewidth of each first mask pattern 56, then a thickness of an interval between adjacent second mask patterns 58 is also equal to the linewidth of the first mask pattern.

The second mask patterns 58 may be formed by a chemical absorption method using a photoresist. If a chemical absorption method is used to form a second photoresist, the second photoresist may be formed on first photoresist patterns constituting the first mask patterns 56. If the formed second photoresist is bake-processed, the bake-processed second photoresist may react to an acid remaining on a surface of the first photoresist, so that a portion of the second photoresist that contacts the first photoresist combines as a polymer. When the second photoresist combined as the polymer is rinsed and a non-reacted second photoresist is removed, a second photoresist layer formed on sidewalls and an upper surface of the first photoresist may remain as a polymer, so that the second mask pattern 58 may be formed.

Figure 9:
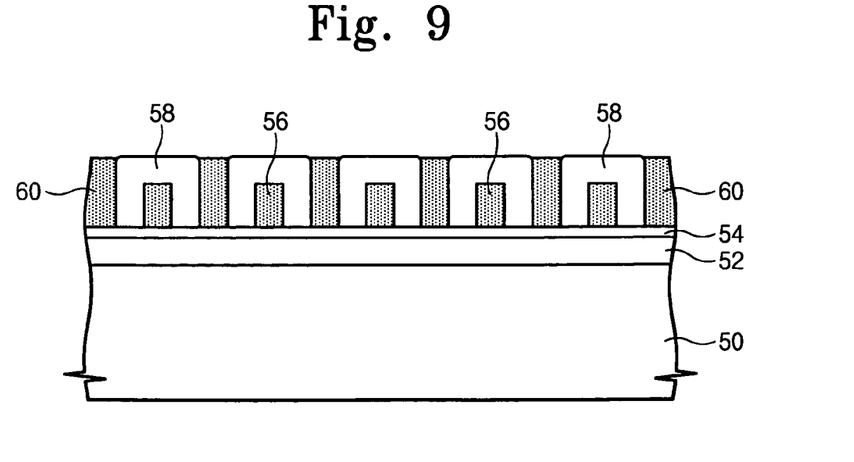

Referring to FIG. 9, an interval between adjacent second mask patterns 58 may be filled to form third mask patterns 60. Each of the third mask patterns 60 may be formed of an organic layer containing silicon. For example, the third mask patterns 60 may be formed of a photoresist containing silicon. The photoresist containing silicon may be formed on the second mask pattern 58, and an upper portion of the photoresist containing silicon may be selectively removed using a surfactant rinse solution, so that the third mask patterns 60 may be formed. The third mask patterns 60 and the first mask patterns 56 may be alternately arranged and may form mask patterns of a stripe shape having a constant pitch.

On the other hand, according to an example embodiment, before the third mask patterns 60 are formed, an operation of curing a surface of the second mask patterns 58 may be performed. The curing may reduce and/or prevent a coating defect of the third mask patterns 60 and/or improve pattern fidelity. The operation of curing the surface of the second mask patterns 58 may be performed through a photoresist curing process that uses one of Ar plasma treatment, HBR plasma treatment, UV curing, E-Beam curing, and Ar implantation.

Also, the operation of forming the third mask patterns 60 may include coating a water-soluble layer containing an acid and baking the coated layer to diffuse the acid into the layer. At this point, the water-soluble layer may be recessed to correspond to a length the acid is diffused during the baking. The layer forming method including the coating of the water-soluble layer containing the acid and the baking of the coated layer may be used for the operation of forming the first mask patterns 56 and the second mask patterns 58.

Figure 10:
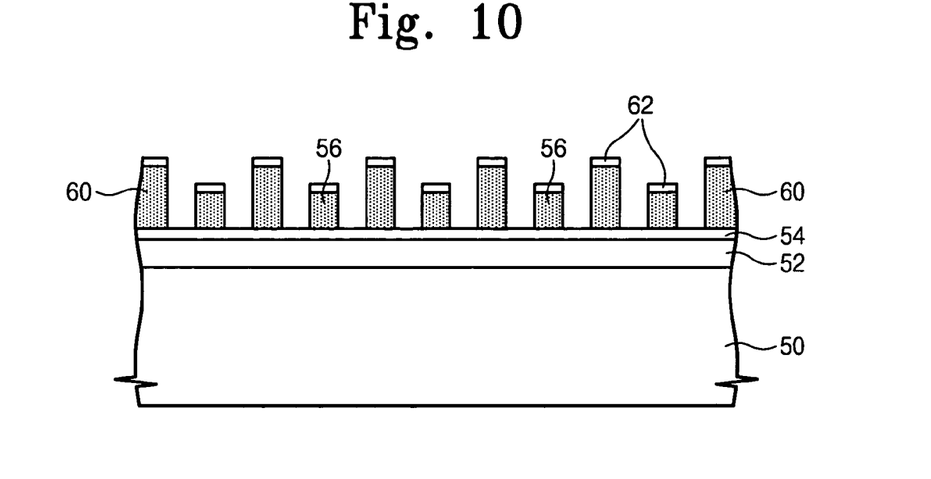

Referring to FIG. 10, the formed third mask pattern 60 may be ashing-processed using oxygen plasma. Each of the first mask patterns 56 and the third mask patterns 60 may be formed of an organic layer containing silicon, but each of the second mask patterns 58 may be formed of an organic layer not containing silicon. The second mask patterns 58 may be selectively removed by the oxygen plasma ashing, thereby forming a mask layer of a stripe shape including the first mask patterns 56 and the third mask patterns 60 formed on the substrate.

A silicon oxide layer 62 where the silicon contained in the organic layer and oxygen combine may be formed on upper surfaces of the first mask patterns 56 and the third mask patterns 60. When the hard mask layer 54 is formed of a material having etching selectivity with respect to the silicon oxide layer, the silicon oxide layer 62 may be used as a mask layer to remove the hard mask layer 54.

Referring to FIG. 11, the hard mask layer 54 and the material layer 52 may be patterned using the first mask patterns 56 and the third mask patterns 60 as etch masks to form a plurality of first material layer patterns 52a arranged with a constant pitch on the semiconductor substrate 50 and a plurality of second material layer patterns 52b alternately arranged with respect to the first material layer patterns 52a. The first material layers 52a may be formed by transferring the first mask patterns 56, and the second material layers 52b may be formed by transferring the third mask patterns 58. The first material layer patterns 52a and the second material layer patterns 52b constitute stripe patterns arranged with a constant pitch on the semiconductor substrate 50. According to an example embodiment, since the third mask patterns 60 may be self-aligned with the first mask patterns 56, the first material layer patterns 52a and the second material layer patterns 52b are not misaligned. Also, since the second mask patterns 58 may be removed using the oxygen plasma ashing to leave the first mask patterns 56 and third mask patterns 60 on the substrate, exposure defects similar to those which may be generated in a conventional double exposure process may be reduced and/or prevented.

According to an example embodiment, the hard mask layer 54 may be patterned using the first mask patterns 56 and the third mask patterns 60 to form the hard mask pattern; the first and third mask patterns 56 and 60 may be removed; and then the material layer 52 may be etched using the hard mask pattern as an etch mask.

Figure 12:
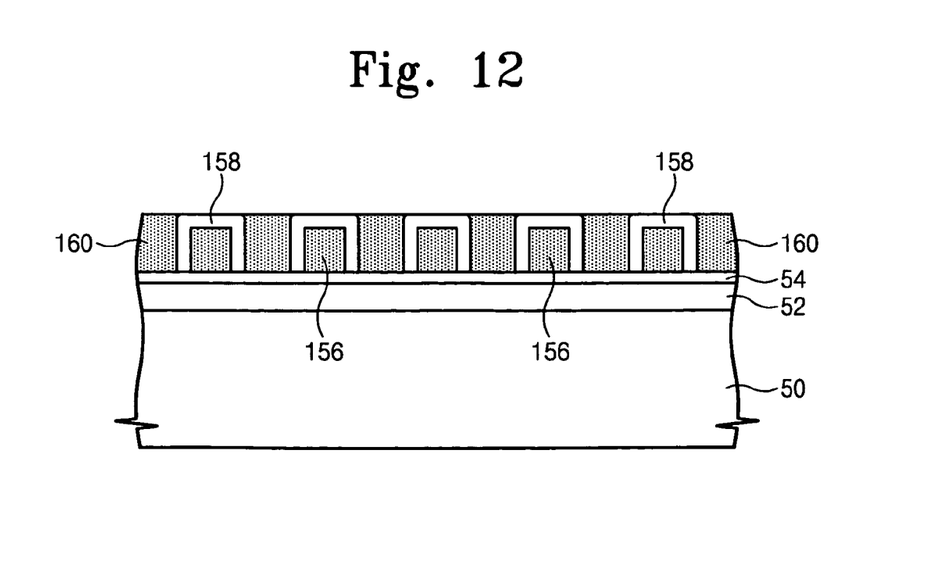
FIGS. 12 and 13 are cross-sectional views illustrating an example embodiment of a method for forming a pattern.
Figure 13:
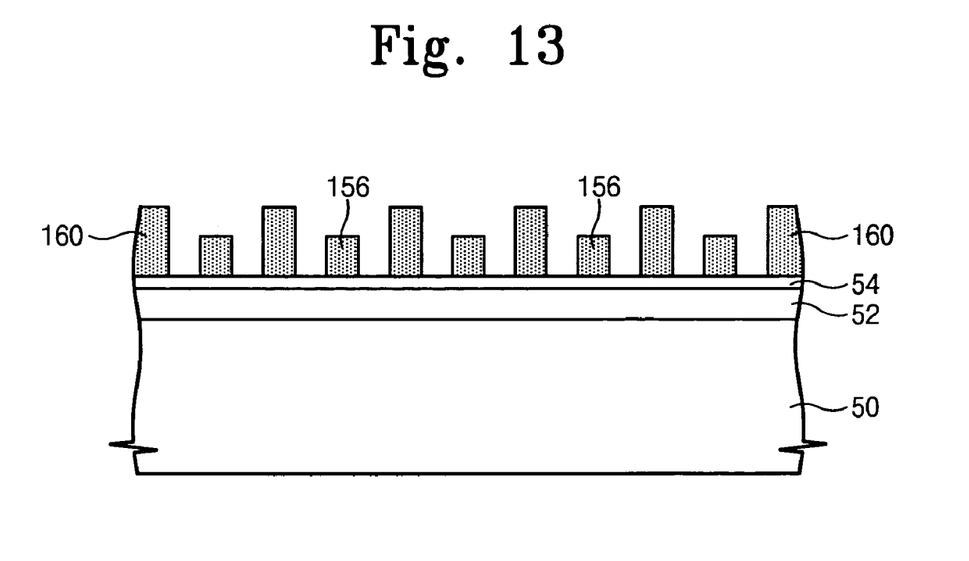

FIGS. 12 and 13 are cross-sectional views illustrating another example embodiment of a method for forming a pattern.

Referring to FIG. 12, similar to the above-described example embodiments, first mask patterns 156, second mask patterns 158, and third mask patterns 160 may be formed on a hard mask 54. However, according to the example embodiment illustrated in FIG. 12, the first mask patterns 156 may be formed larger than a target width, and the second mask patterns 158 may be formed relatively thin so that the third mask patterns 160 may also have a larger width than a target width. Each of the first, second, and third mask patterns 156, 158, and 160 may be formed of an organic mask pattern. For example, each of the first, second, and third mask patterns 156, 158, and 160 may be formed of a photoresist. The second mask pattern 158 may be formed of a photoresist having a faster developing speed than the developing speeds of the first and third mask patterns 156 and 160.

Referring to FIG. 13, the second mask patterns 158 may be selectively removed to leave the first and third mask patterns 156 and 160 on a substrate. For example, each of the first mask patterns 156 and the third mask patterns 160 may be formed of a photoresist having a slower after-exposure developing speed than the developing speed of the second mask patterns 158, so that the second mask patterns 158 may be selectively removed after exposure. Otherwise, each of the first mask patterns 156 and the third mask patterns 160 may be formed of a photoresist having a slower before-exposure developing speed than developing speeds of the second mask patterns 158, so that only the second mask patterns 158 may be selectively removed after exposure. For example, mask patterns are formed using a negative resist where coupling of a polymer is strengthened by exposure, or using a positive resist where coupling of a polymer is weakened by exposure, so that a second mask layer may be removed before exposure or after exposure.

As illustrated, a portion of the first mask patterns 156 and the third mask patterns 160 may be removed, so that a width of the first and third mask patterns 156 and 160 may be reduced. Therefore, according to an example embodiment, a width of the first and third mask patterns 156 and 160 may be formed with a larger linewidth to adjust for a portion of the first and third mask patterns 156 and 160, which is removed during removal of the second mask patterns 158, to obtain the target width.

Though not shown, the hard mask layer 54 may be patterned using the first and third mask patterns 156 and 160 as etch masks, and a material layer 52 may be patterned using the patterned hard mask layer 54 as an etch mask. Alternatively, the hard mask layer 54 and the material layer 52 may be sequentially patterned using the first and third mask patterns 156 and 160 as etch masks.

Figure 14:
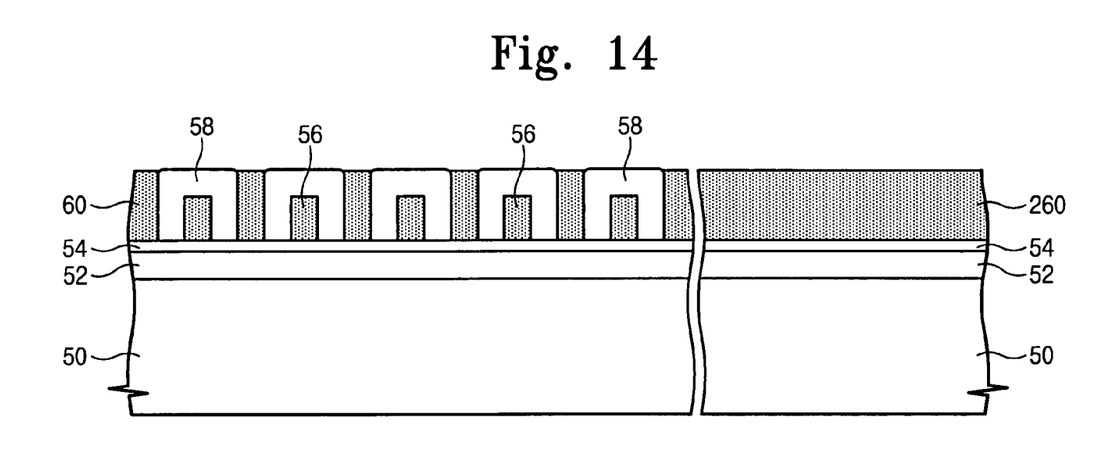
FIGS. 14-16 are cross-sectional views illustrating an example embodiment of a method for forming a pattern.
Figure 16:
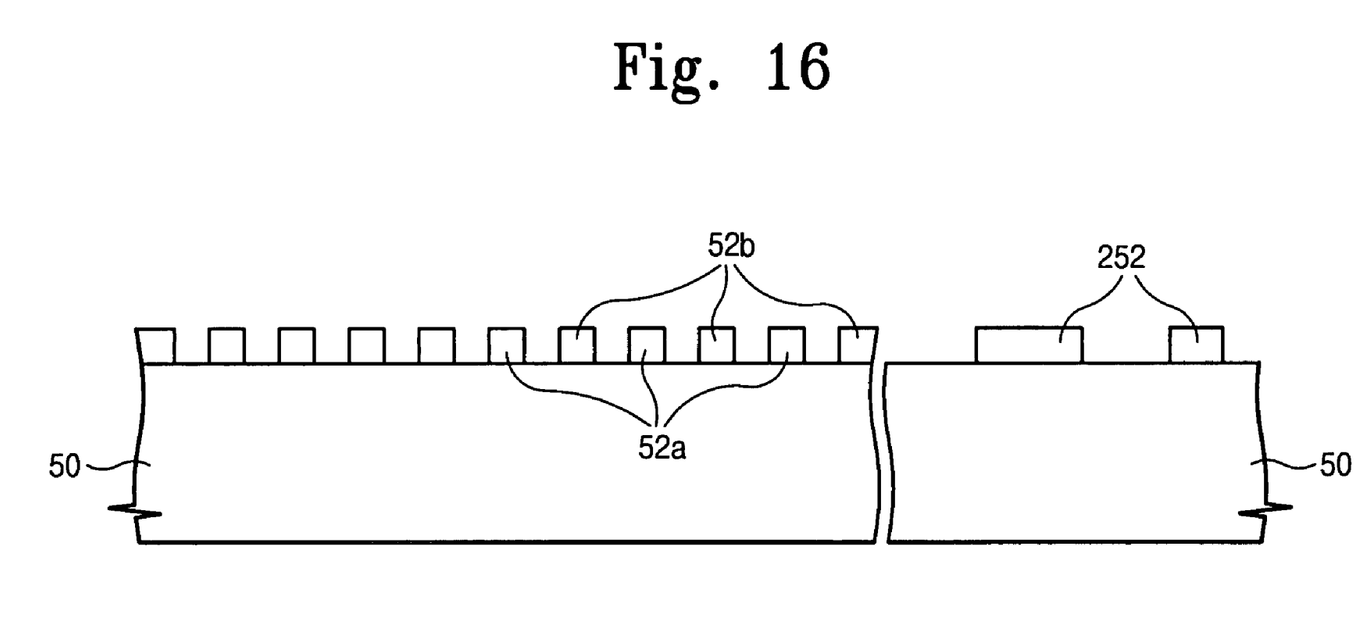

FIGS. 14 and 16 are cross-sectional views illustrating still another example embodiment of a method for forming a pattern.

Referring to FIG. 14, regularly arranged patterns and irregularly arranged patterns may be simultaneously formed. Generally, a cell array of a memory device includes regular patterns where the same pattern is repeated and a peripheral circuit region includes irregular patterns in order to realize various logic circuits. First mask patterns 56, second mask patterns 58, and third mask patterns 60 may be formed on a substrate where a hard mask layer 54 is formed using a method similar to the method previously described with respect to FIG. 9. A mask layer 260 may be formed on an entire surface of the substrate where the second mask patterns 58 are formed, and the upper portion of the mask layer 260 may be removed, so that the third mask patterns 60 may be formed in gaps between the second mask patterns 58. At this point, another region of the semiconductor substrate 50, for example, a peripheral circuit region of a semiconductor memory device may be covered with the mask layer 260.

Figure 15:
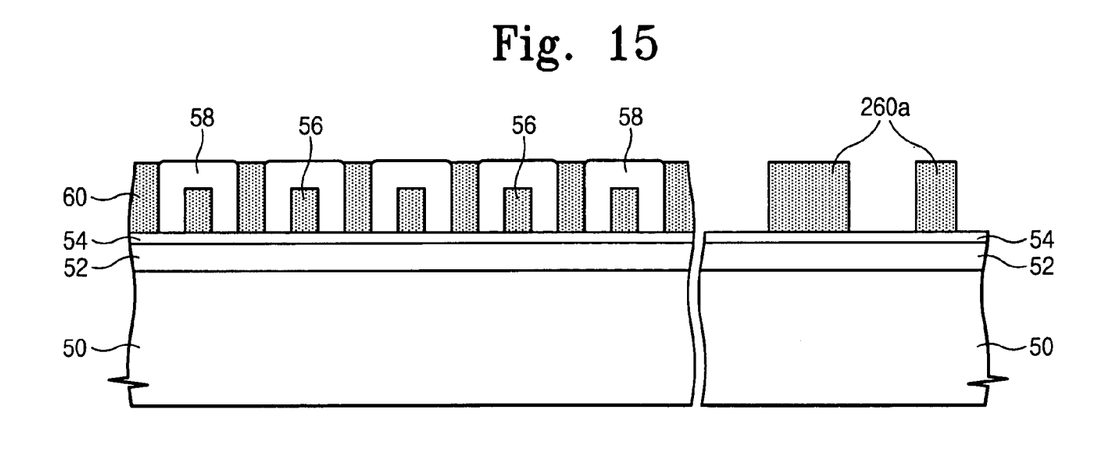

Referring to FIG. 15, the mask layer 260 may be patterned to form fourth mask patterns 260a. The fourth mask patterns 260a may define irregular patterns in another region of the semiconductor substrate, for example, a peripheral circuit region. Subsequently, the second mask patterns 58 may be removed, and lower layers may be etched using the first, third, and fourth mask patterns 56, 60, and 260a as etch masks to form a first material layer pattern 52a, second material layer pattern 52b repeatedly arranged with a constant pitch, and irregular third material layer patterns 252 as illustrated in FIG. 16.

FIGS. 14 to 16 further illustrate that regardless of which previously described example is used to form regular patterns, it is possible to form third irregular material layer patterns 252 having various shapes on another region of the semiconductor substrate such as a peripheral circuit region, for example, using the mask layer used to form the third mask patterns.

As described above, according to example embodiments, fine regular patterns may be formed using a difference in oxygen plasma ashing characteristics between an organic layer containing silicon and an organic layer not containing silicon and without double exposure. Further, fine patterns may be formed by forming photoresist patterns having different developing speeds and selectively removing the photoresist patterns using the difference in the developing speeds of the photoresist patterns. Therefore, misalignment between a first exposure and a second exposure that may be generated during a conventional double exposure may be reduced and/or prevented, and a fine pattern may be formed with a constant pitch.

According to example embodiments, regular patterns may be formed having a linewidth and a pitch that cannot be obtained using conventional photolithography processes.

It will be apparent to those skilled in the art that various modifications and variations can be made to the example embodiments. Thus, it is noted that this disclosure is intended to cover all modifications and variations of the example embodiments falling within the scope of the appended claims and their equivalents.

What is claimed is:

1. A method for forming a pattern, the method comprising:
    forming first mask patterns on a substrate;
    forming second mask patterns on sidewalls of the first mask patterns;
    forming third mask patterns at least partially filling spaces between adjacent second mask patterns;
    removing the second mask patterns, after forming the third mask patterns; and
    removing a portion of the substrate using the first and third mask patterns as etch masks, wherein
    each of the first mask patterns and the third mask patterns is formed of an organic layer containing silicon, and
    each of the second mask patterns is formed of an organic layer without silicon and is removed using oxygen plasma ashing to form a mask layer including the first mask patterns and the third mask patterns, wherein
    the first mask patterns are arranged in a striped shape having a pitch,
    the second mask patterns are arranged on the sidewalls and an upper surface of the first mask patterns,
    forming the third mask patterns includes,
        forming a photoresist containing silicon on the first and second mask patterns to fill the spaces between the adjacent second mask patterns, and
        removing an upper portion of the photoresist until the second mask patterns on the first mask patterns are exposed, and
    the second mask patterns cover an entirety of the sidewalls of the first mask patterns and an entirety of the upper surface of the first mask patterns such that the first mask patterns are protected by the second mask patterns during the removing of the upper portion of the photoresist.

2. The method of claim 1, wherein removing of the plurality of second mask patterns includes forming a silicon oxide layer on the first and third mask patterns.

3. The method of claim 1, wherein,
    each of the first, second, and third mask patterns is formed of a photoresist;
    the second mask patterns have a higher developing speed than a developing speed of the first and third mask patterns; and
    the second mask patterns are removed based a difference between the higher developing speed of the second mask patterns and the developing speed of the first and third mask patterns.

4. The method of claim 3, wherein each of the first and third mask patterns is formed having a first width larger than a target width, and removing the second mask patterns reduces the first width of the first and third mask patterns to the target width.

5. The method of claim 1, wherein the first mask patterns are arranged in a stripe shape having a pitch.

6. The method of claim 1, wherein the second mask patterns are formed using chemical absorption.

7. The method of claim 1, wherein the second mask patterns are formed on the sidewalls of the first mask pattern to have a thickness substantially equal to a width of each of the plurality of first mask patterns.

8. The method of claim 1, wherein a width between the adjacent second mask patterns is substantially equal to the width of each of the first mask patterns.

9. The method of claim 1, wherein a width of the spaces between adjacent first mask patterns is three times a width of each of the first mask patterns, and a thickness of the second mask patterns on the sidewalls of the first mask patterns is substantially equal to the width of each of the first mask patterns.

10. The method of claim 1, further comprising:
forming a fourth organic mask pattern on a region of the substrate, wherein
the removing the portion of the substrate includes etching a portion of the region using the fourth organic mask pattern as an etch mask.

11. The method of claim 1, further comprising:
curing a surface of the second mask patterns before forming the third mask patterns using at least one of Ar plasma treatment, HBR plasma treatment, UV curing, E-Beam curing, and Ar implantation.

12. The method of claim 1, wherein forming the third mask patterns comprises:
forming a photoresist containing silicon on the second mask patterns; and
etching an upper portion of the photoresist containing silicon until a height of the photoresist containing silicon is substantially equal to a height of the first mask patterns.

13. The method of claim 12, wherein etching the upper portion is performed with a surfactant rinse solution that includes an alcohol compound containing ethylene glycol and poly propylene glycol, and the alcohol compound includes one to ten carbons, and has one selected from the group including of mon-, di-, triple-, and multi-alcohol function groups.

14. The method of claim 12, wherein forming the third mask pattern comprises:
coating a water-soluble layer containing an acid; and
baking the coated water-soluble layer.

15. The method of claim 1, wherein,
the first mask patterns are photoresist patterns and arranged in a stripe shape having a constant pitch;
the second mask patterns are photoresist patterns having a faster removing speed than a removing speed of the first mask patterns and the third mask patterns;
the third mask patterns are photoresist patterns; and
the second mask patterns are removed using oxygen plasma aching to form a mask layer including the first mask patterns and the third mask patterns.

16. The method of claim 15, wherein each of the first and third mask patterns is formed having a first width larger than a target width, and removing the second mask patterns reduces the first width of the first and third mask patterns to the target width.

17. The method of claim 1, wherein removing the second mask patterns includes exposing a portion of substrate between the first mask patterns and the third mask patterns adjacent to each other.

18. The method of claim 1, wherein forming the third mask patterns is free of an exposure process.

19. The method of claim 1, further comprising:
forming a first pattern and a second pattern under the first mask pattern and the third mask pattern adjacent to each other, wherein
the first pattern and the second pattern are formed by removing a portion of the substrate using the first and the third mask patterns adjacent to each other as etch masks, and
the first pattern is separated from the second pattern.

20. The method of claim 1, further comprising:
patterning a photoresist on another region to form fourth mask patterns before the removing of the portion of the substrate, wherein,
the photoresist for the third mask patterns is formed on the another region of the substrate separated from a region of the substrate on which the first, second and third mask patterns are formed,
the removing of the upper portion of the photoresist further includes removing an upper portion of the photoresist on the another region.

21. The method of claim 1, wherein the forming of the second mask patterns forms the second mask patterns without anisotropic etching.

* * * * *